(12) United States Patent
Rabjohn et al.

(10) Patent No.: US 8,278,963 B2
(45) Date of Patent: Oct. 2, 2012

(54) POWER DETECTOR AND METHOD FOR DETECTING POWER

(75) Inventors: Gordon G. Rabjohn, Ottawa (CA); Johan Grundlingh, Kinburn (CA); Adrian Long, Syresham (GB)

(73) Assignee: SiGe Semiconductor Inc., Ottawa, Ontario (CA)

( * ) Notice: Subject to any disclaimer, the term of this patent is extended or adjusted under 35 U.S.C. 154(b) by 330 days.

(21) Appl. No.: 12/758,130

(22) Filed: Apr. 12, 2010

(65) Prior Publication Data

US 2011/0248703 A1    Oct. 13, 2011

(51) Int. Cl.
*G01R 31/02*    (2006.01)
*G01R 1/30*    (2006.01)

(52) U.S. Cl. ......... 324/762.01; 324/762.08; 324/762.09; 324/123 R

(58) Field of Classification Search ............ 324/123 R, 324/762.01–762.09; 327/57–71
See application file for complete search history.

(56) References Cited

U.S. PATENT DOCUMENTS

| | | | | |
|---|---|---|---|---|
| 5,900,765 | A * | 5/1999 | Kawasaki et al. | 327/362 |
| 6,233,440 | B1 * | 5/2001 | Taylor | 455/127.2 |
| 6,304,145 | B1 * | 10/2001 | Laureanti et al. | 330/285 |
| 6,762,647 | B1 * | 7/2004 | Apel | 330/279 |
| 6,972,628 | B2 * | 12/2005 | Eo et al. | 330/285 |
| 7,135,849 | B1 * | 11/2006 | Yamamoto | 324/103 P |
| 8,067,953 | B2 * | 11/2011 | Lany et al. | 324/762.08 |

* cited by examiner

*Primary Examiner* — Joshua Benitez
(74) *Attorney, Agent, or Firm* — Morris & Kamlay LLP

(57) ABSTRACT

A circuit and method are provided for detecting a power of a signal amplified in a power amplifier. A diode and a voltage bias source are used to shift a voltage of the signal taken at a base of an amplifying transistor of the power amplifier, to generate a positive signal. The positive signal is provided to a base input of an emitter follower exhibiting high input impedance to generate a power detector output which follows the positive signal.

12 Claims, 3 Drawing Sheets

POWER DETECTOR AND METHOD FOR DETECTING POWER

FIELD OF THE INVENTION

The invention relates to power detectors, and more particularly to circuits and methods for improvement of tolerance to impedance mismatch, voltage range, and frequency response of a power detector.

BACKGROUND OF THE INVENTION

In RF communications is often useful to be able to measure the power available at an output of the RF power amplifier. In order to measure the power of signals being transmitted, a power detector is implemented along the signal path in the RF power amplifier. In a typical multistage amplifier, a power detector may be located at the final stage and is usually coupled to the collector or base of the final stage amplifying transistor.

The simplest known power detector is a diode junction which is coupled along the signal path. This diode is commonly forward biased to improve dynamic range by pulling the diode closer to its turn on voltage. The approach of using a single diode is not often taken because it loads the RF source, and all of the energy produced at the DC output of the power detector comes from the RF signal and hence reduces the RF signal strength.

In order to present higher impedance to the RF source and hence cause minimal power reduction in the RF signal, the most commonly used power detector is a transistor in an emitter follower power detector configuration. In this well-known power detector, the base of the transistor is pulled to a voltage that turns the transistor on slightly, resulting in, for example, 300 mV on the emitter, the base is coupled to receive the RF signal, while the collector is coupled to a constant voltage source for example $V_{CC}$. In response to a varying RF signal, the emitter follower acts as a rectifier, the emitter rising above ground during positive RF swings and the emitter dropping only marginally below ground on negative RF swings. This power detector configuration not only presents a "light" load to the RF amplifier, it does so while maintaining low output impedance. The energy produced at the DC output of this power detector comes from the constant voltage source and not from the RF signal.

As discussed above, a power detector is often coupled to the collector or base of the transistor of the final stage of the power amplifier. There are advantages and disadvantages to each alternative.

If the power detector is connected at the collector of the transistor of the final stage, the power detector will advantageously be presented with a large voltage swing, however, the frequency response of the power detector would be quite poor because the collector is presented with a load that is substantially reactive leading to an uneven frequency response. This can be alleviated somewhat by employing a matching network between the tap point and the power detector, however, the power detector presents such a high impedance load that the size of the required inductors is prohibitive for high frequency applications, such as applications involving the 2-5 GHz band.

Power detectors utilized in association with amplifiers used for WiLAN front end modules are often connected to the base input of the transistor of the last stage of amplification. In this case, the power detector will advantageously be isolated from changes in impedance presented to the output of the power amplifier, however, due to the relatively low voltage swing at the base of the transistor of the last stage of amplification, the DC voltage from the power detector will consequently be relatively weak. Due to the poor frequency response which would result from the placement of the power detector at the collector as described above, this approach of coupling at the base is more commonly used.

A well known approach used to compensate for the relatively weak signal output from the power detector when connected to the base of the transistor of the last stage of amplification, is the employment of a voltage doubler to double the voltage provided from the power detector output. Typical voltage doublers are based on diodes and they present a load to the RF stage driving it.

FIG. 1a illustrates a typical voltage doubling power detector according to the prior art. The power detector generally indicated by 100a has an RF input port $RF_{IN}$ which is coupled with a series first capacitor 110 to a cathode of a first diode 120. The cathode of the first diode 120 is also coupled to an anode of a second diode 130. An anode of the first diode 120 is coupled to ground. A cathode of the second diode 130 is coupled to a second capacitor 140 to ground, to a resistor 150 to ground, and is coupled to an output $DC_{OUT}$ of the power detector 100a.

The RF input port $RF_{IN}$ of the power detector 100a receives a detected RF signal to be doubled. This typically originates along a signal path in the RF amplifier and is coupled to detect a voltage of the RF signal passing therethrough. During negative half-cycles of the RF signal the first diode 120 is forward biased into an ON state while the second diode 130 is reverse biased to an OFF state. During these negative half cycles capacitor 110 will be charged to a peak voltage of the RF signal. During positive half cycles, the first diode 120 is reverse biased into an OFF state while the second diode 130 is forward biased to an ON state. During these positive half cycles the second capacitor 140 is charged by the discharge of the first capacitor 110, and once enough cycles have occurred, the peak voltages presented to the output $DC_{OUT}$ of the power detector is roughly twice that of the peak voltage presented to the input $RF_{IN}$ of the power detector 100a. The resistor 150 along with the capacitor 140 define an RC time constant that suppresses the RF energy at $DC_{OUT}$, and allows DC and baseband voltages to appear at $DC_{OUT}$.

The prior art power detector 100a depicted in FIG. 1a has the drawback that each of the first and second diodes 120, 130 do not enter an ON state until the forward voltage exceeds a certain threshold which may be as high as between 0.7V-1.3V depending upon the semiconductor type. This forward voltage prevents the detector from responding to small RF signals.

In FIG. 1b is depicted a prior art power detector 100b which compensates for the threshold voltage which must be reached to cause the first and second diodes 120, 130 to enter the ON state. The power detector 100b of FIG. 1b is the same as the power detector 100a of FIG. 1a in every respect except that the first diode 180 of the power detector 100b is not connected to ground but instead is forward biased by a DC bias source 160. The voltage provided by the DC bias source 160 to the anode of first diode 180 is a voltage which is just below the threshold voltage for turning the first diode 180 and second diode 130 into the ON state. This causes the first diode 180 to be forward biased as soon as the RF signal begins to swing into negative voltages. Since the first diode 180 turns on earlier during the negative cycle, the first capacitor 110 charges to a higher voltage which in turn during the positive cycles charges the second capacitor 140 through the second diode 130 to a higher level providing an overall increase in dynamic range at the output $DC_{OUT}$.

As described above, these prior art approaches present a substantial load to the RF signal passing through the RF amplifier and hence consumes a substantial amount of RF energy.

The invention provides for a solution which simultaneously mitigates multiple problems with prior art approaches such as low input impedance, high output impedance, low output signal, and uneven frequency response.

SUMMARY OF THE INVENTION

According to a first aspect, the invention provides for a method of detecting a power of a signal transmitted by a power amplifier, the method comprising: receiving the signal at an input of the power detector, the input of the power detector coupled to one of a base and a gate, of an amplifying device in the power amplifier; shifting a voltage of the signal positively by a magnitude of a peak voltage of the signal generating a positive signal; providing the positive signal to a base input of an emitter follower generating a follower signal which follows the positive signal; and providing the follower signal to an output of the power detector, and to a first capacitor coupled to ground; wherein the emitter follower presents a high impedance at the input of the power detector.

In some embodiments, the step of shifting the voltage of the signal comprises: providing the signal across a capacitor to a cathode of a diode; wherein the cathode of the diode is coupled to the base input of the emitter follower, and wherein an anode of the diode is coupled to a voltage bias source.

In some embodiments of the invention, the diode comprises a Schottky diode, wherein the voltage bias source comprises a temperature compensating voltage bias source, and wherein the emitter follower comprises a first transistor.

In some embodiments of the invention, the first transistor comprises a BJT, wherein a collector of the BJT is coupled to a voltage supply, wherein the base input of the emitter follower is a base of the BJT, and wherein an emitter of the BJT is coupled to the output of the power detector and the first capacitor.

Some embodiments of the invention further provide for biasing a second transistor coupled between the output of the detector and ground thereby providing operating current for the first transistor.

Some embodiments of the invention further provide biasing a second transistor coupled between the cathode of the Schottky diode and ground thereby boosting current passing through the Schottky diode.

According to another aspect the invention provides for a power detector circuit for detecting a power of a signal transmitted by a power amplifier, the power detector comprising: an input for receiving the signal coupled to one of a base and a gate of an amplifying device in the power amplifier; a voltage shifting circuit for shifting a voltage of the signal positively by a magnitude of a peak voltage of the signal and for generating a positive signal; an emitter follower for receiving at a base input of the emitter follower the positive signal, and for generating a follower signal which follows the positive signal; a first capacitor coupled to the emitter follower for receiving the follower signal, the first capacitor also coupled to ground; and an output for providing the detector voltage output signal from a combination of a voltage of the capacitor and the follower signal, wherein the emitter follower presents a high impedance at the input of the power detector.

In some embodiments of the invention, the voltage shifting circuit comprises: a capacitor coupled on a first side to the input of the power detector; a diode, wherein a cathode of the diode is coupled to a second side of the capacitor and is coupled to the base input of the emitter follower, and a voltage bias source coupled to an anode of the diode.

In some embodiments of the invention, the diode comprises a Schottky diode, wherein the voltage bias source comprises a temperature compensating voltage bias source, and wherein the emitter follower comprises a first transistor.

In some embodiments of the invention, the first transistor comprises a BJT, wherein a collector of the BJT is coupled to a voltage supply, and wherein an emitter of the BJT is coupled to the output of the power detector and the first capacitor.

Some embodiments of the invention further provide for: a second transistor coupled between the output of the detector and ground; and a second voltage bias source coupled to a base of the second transistor for providing operating current for the first transistor at the output of the power detector by appropriate biasing of the second transistor.

Some embodiments of the invention further provide for: a second transistor coupled between the cathode of the Schottky diode and ground; and a second voltage bias source coupled to a base of the second transistor for boosting current passing through the Schottky diode by appropriate biasing of the second transistor.

BRIEF DESCRIPTION OF THE DRAWINGS

The features and advantages of the invention will become more apparent from the following detailed description of the preferred embodiment(s) with reference to the attached figures, wherein.

It is noted that in the attached figures, like features bear similar labels.

DETAILED DESCRIPTION OF THE PREFERRED EMBODIMENTS

The invention described herein below mitigates the aforementioned drawbacks of known systems by replacing the second diode with a follower, providing high input impedance to the detector, allowing its placement at the base of the amplifying transistor of the final stage of the RF amplifier for isolation from the RF amplifier output impedances, and provides an independent voltage source to provide DC output which consequently reduces the use of the energy of the RF signals passing through the RF amplifier.

Figure 2:
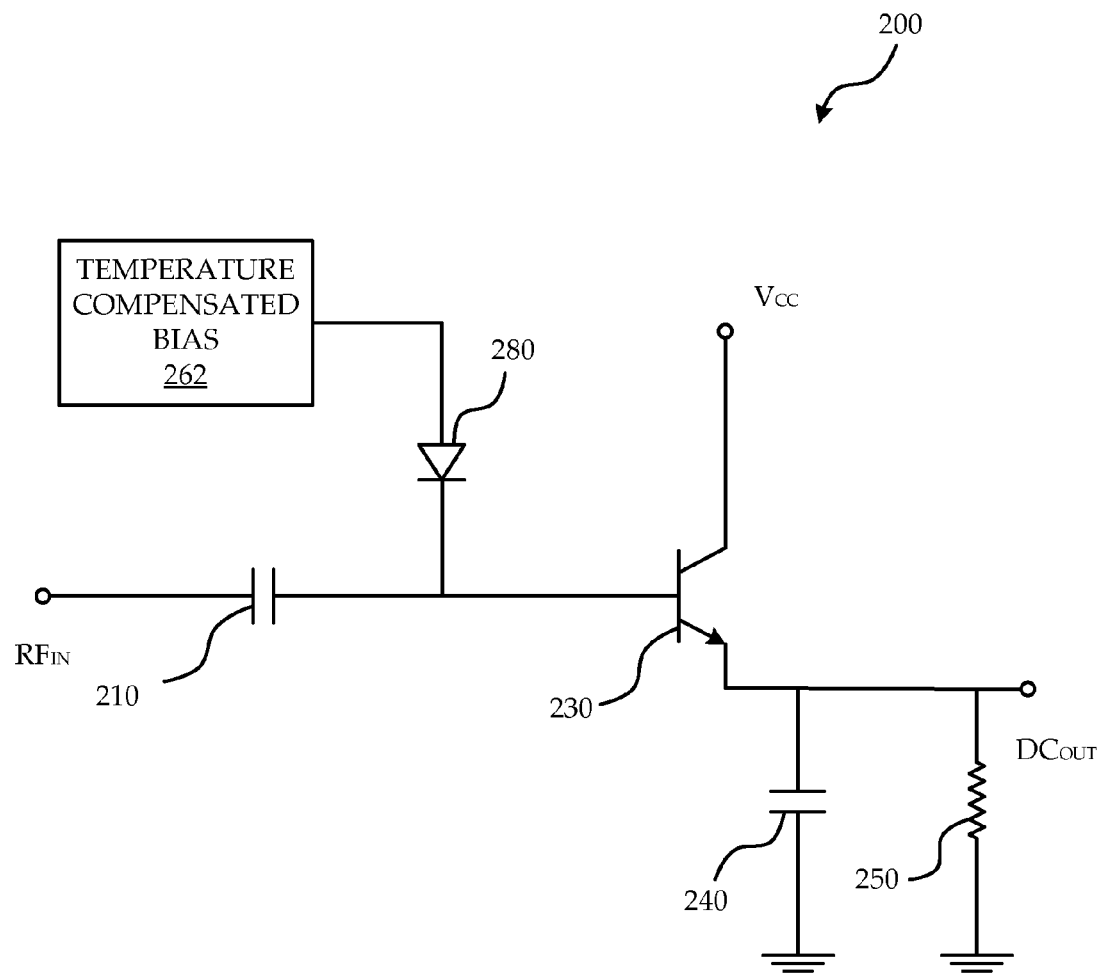
FIG. 2 is a block diagram illustrating a power detector according to an embodiment of the invention.

Referring to FIG. 2, a power detector, generally indicated by the numeral 200, according to an embodiment of the invention will now be described in terms of structure. The power detector 200 has an RF input port $RF_{IN}$ which is coupled with a series first capacitor 210 to a cathode of a first diode 280. The cathode of the first diode 280 is also coupled to a base of an emitter follower in the form of a BJT transistor 230. An anode of the first diode 280 is coupled to a temperature compensating bias source 262. A collector of the transistor 230 is coupled to a constant voltage supply which in this case is $V_{CC}$. An emitter of the transistor 230 is coupled to a second capacitor 240 to ground, to a resistor 250 to ground, and is also coupled to an output of the power detector 200, namely, $DC_{OUT}$.

The power detector 200 of FIG. 2 will now be described in terms of its function. The RF input port $RF_{IN}$ of the power detector 200 receives an RF signal to be detected. During negative half-cycles of the RF signal the first diode 280 is forward biased into an ON state while the transistor 230 is reverse biased at its base to an OFF state. The first diode 280 is forward biased by the temperature compensating bias source 262. The voltage provided by the temperature compensated bias source 262 to the anode of first diode 280 is a voltage which is just below the threshold voltage for turning the first diode 280 into the ON state. This causes the first diode 182 be forward biased as soon as the RF signal begins to swing into negative voltages. During these negative half cycles capacitor 210 is charged to a peak voltage of the RF signal. This results in the largest negative swings of the RF signal appearing as 0 V to the base of the transistor 230 and appearing as the magnitude of the peak voltage of the RF signal when the RF signal is 0 V. This is equivalent to shifting the signal by a positive voltage of a magnitude equal to the magnitude of the peak voltage of the RF signal. During positive half cycles, the first diode 280 is reverse biased into an OFF state while the transistor 230 is forward biased to an ON state. During these positive half cycles the base of the transistor 230 sees the voltage level acquired by the first capacitor 210 during the negative half cycles plus the positive voltage swings imparted by the RF signal during the positive half cycle. The voltage at the emitter follows the voltage at the base and is provided at the emitter to charge the second capacitor 240. The voltage provided at the emitter of the transistor is not provided as a consequence of any discharge of a capacitor, and instead directly follows the RF signal as shifted by the voltage of the first capacitor 210. As with the prior art, the resistor 250 along with the second capacitor 240 define an RC time constant that suppresses the RF energy at $DC_{OUT}$, and allows DC and baseband voltages to appear at $DC_{OUT}$.

The transistor 230 of the power detector 200 depicted in FIG. 2, can provide at least twice as much output voltage as that provided by known solutions due to its reliance upon an external voltage source of $V_{CC}$ to provide the output voltage of the detector and due to its not relying upon the voltage of the input signal, and due to the use of charge stored in the first capacitor 210 to drive the base of the transistor 230 at a higher voltage resulting in a larger output voltage. Consequently, the presence of the transistor 230 creates a lower output impedance as well as a higher input impedance, simultaneously mitigating various drawbacks of the prior art.

Due to its ability to provide a relatively large output voltage for a given input voltage, the power detector 200 depicted in FIG. 2 may be advantageously coupled to a base of the transistor of the final stage amplifier. Since the power detector is utilizing the signals provided to the base of the transistor of the final stage amplifier, the frequency response of the detector is substantially as flat as the response of the amplifier itself.

Figure 1A:
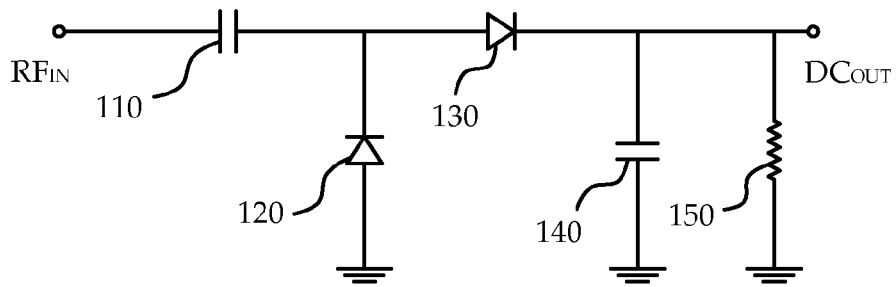
FIG. 1a is a block diagram illustrating a prior art voltage doubling power detector.
Figure 1B:
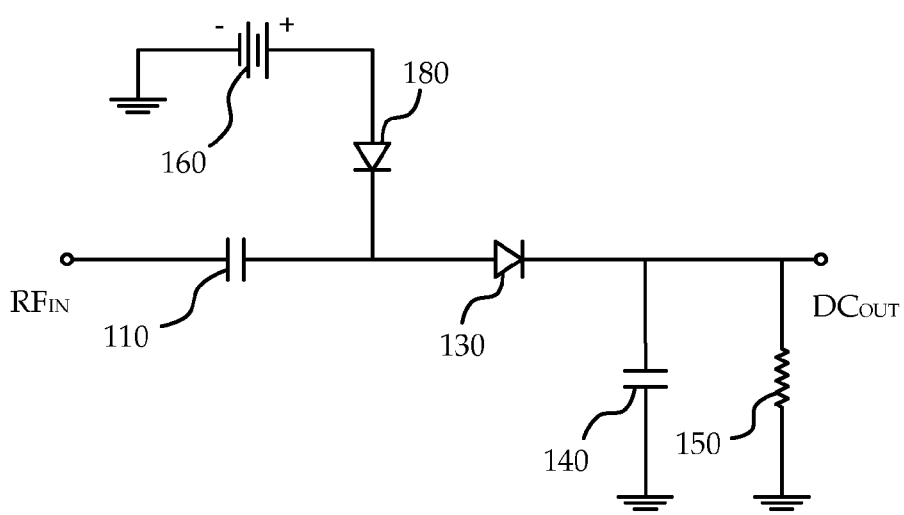
FIG. 1b is a block diagram illustrating a prior art voltage doubling power detector including diode forward biasing.

In some embodiments, the temperature compensated bias source 262 of the power detector 200 depicted in FIG. 2 is simply a constant voltage source similar to the DC bias source 160 depicted in FIG. 1b. Although these embodiments are not temperature stable, they may be used under well controlled conditions, and still mitigate the disadvantages of known detectors, exhibiting the advantages of high input impedance to the detector, isolation from the RF amplifier output impedances, and reduction of utilization of energy of the RF signals passing through the RF amplifier.

Figure 3A:
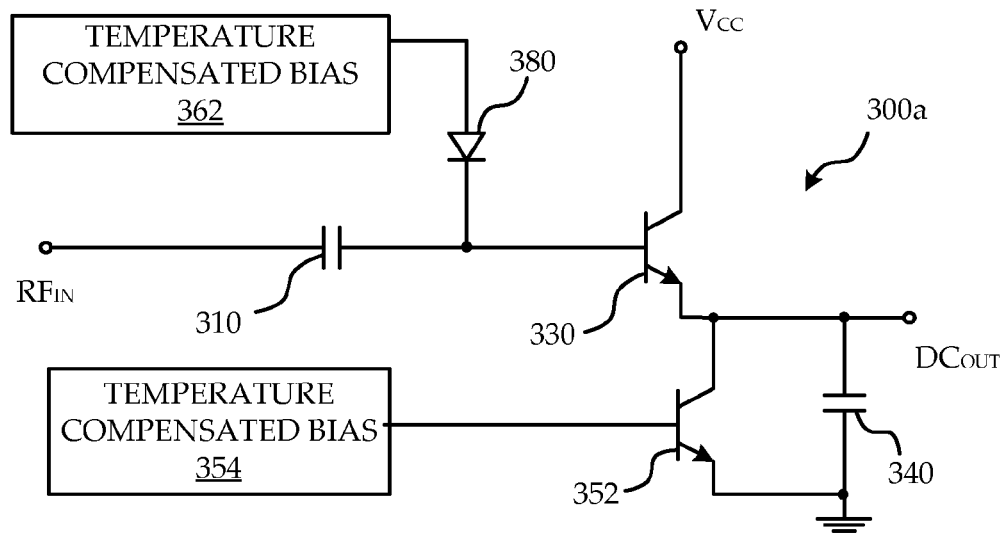
FIG. 3a is a block diagram illustrating a power detector according to an alternative embodiment of the invention.

FIG. 3a depicts a power detector 300a according to an alternative embodiment of the invention in which the resistor 250 of the embodiment depicted in FIG. 2 has been replaced with a load transistor 352 which is biased by a second temperature compensated bias source 354. In this embodiment of the invention, the first diode 380 is a Schottky diode. This load transistor 352 draws essentially a constant current from the transistor 330, regardless of output voltage, and thereby reduces current consumption at high output voltages. Using transistors as loads to replace resistors is beneficial since variations in transistors tend to track each other (and "ratio" each other out) whereas the variations in a transistor tends not to track the variations in resistors.

Figure 3B:
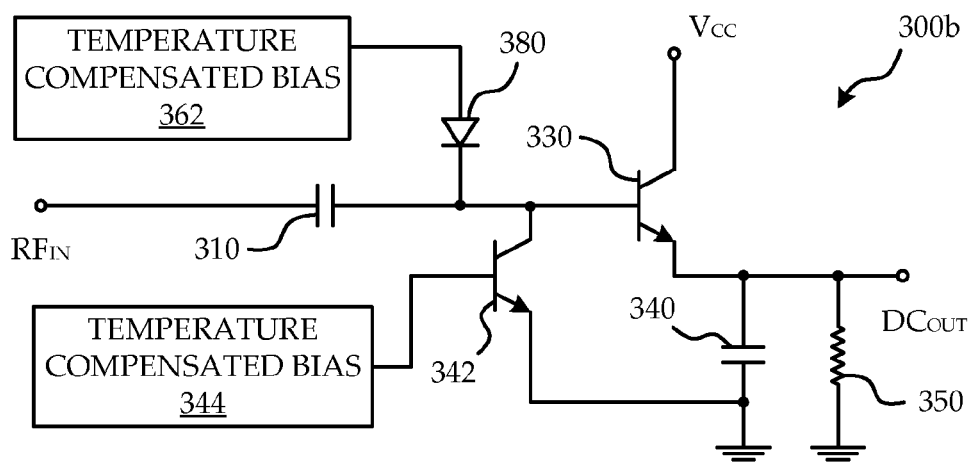
FIG. 3b is a block diagram illustrating a power detector according to a second alternative embodiment of the invention.

FIG. 3b depicts a power detector 300b according to a further alternative embodiment of the invention which has the same structure of the power detector 200 depicted in FIG. 2 except for the addition of a second transistor 342. In this embodiment of the invention, the first diode 380 is a Schottky diode. A collector of the second transistor 342 is coupled to a cathode of the first diode 380, while an emitter of the second transistor 342 is connected to ground. A base of the second transistor 342 is coupled to and biased by a second temperature compensated bias source 344. The second transistor 342 provides a boost to the Schottky current for the first diode 380.

In further alternative embodiments, a second transistor and its associated bias source similar to that depicted in FIG. 3a and a third transistor and associated bias source similar to that depicted in FIG. 3b are simultaneously provided in a power detector circuit which provides a boost to the Schottky current for the first diode 380 and a transistor load or current mirror at the output of the power detector.

For each of these embodiments a number of performance improvements have been observed by the inventors. The frequency response of the power detectors according to the embodiments of the invention described hereinabove exhibit a variance of around 0.5 dB between 5.15 GHz and 5.85 GHz whereas over a similar frequency range, known power detectors display a variance of around 1.5-2.0 dB.

It has also been found that the error in power detector measurement under impedance mismatch conditions at the output of the RF amplifier is considerably smaller than that obtained with known power detectors. Power detectors according to the embodiments described hereinabove have been found to produce errors on the order of ±1 dB whereas prior art detectors commonly exhibit an error on the order of ±2 dB to ±2.5 dB.

The improvements to the power detector as described hereinabove allow for greater accuracy to improve monitoring and control of the RF amplifier both for direct performance reasons, and also for improved monitoring and/or control of the out-of-band and in-band transmissions to ensure more efficient use of the RF amplifier given existing and possible future frequency restrictions and regulations.

Although the embodiments presented have implemented an emitter follower using a bipolar transistor (BJT), a source follower implemented using a field effect transistor (FET), and/or any other suitable follower implemented with a transistor may be used. Although the embodiments presented have been implemented using Schottky diodes for the detector diodes, diodes formed from junctions of a transistor, or source followers, or other PN junction diodes could also be used.

In an alternative embodiment instead of the emitter follower being used to replace a diode of a known voltage doubling power detector, an emitter follower is coupled at its base to an output of a known voltage doubling power detector. This alternative embodiment, although being neither as elegant nor as compact as the embodiments depicted hereinabove, still provides some of the advantages described hereinabove.

The embodiments presented are exemplary only and persons skilled in the art would appreciate that variations to the embodiments described above may be made without departing from the invention. The scope of the invention is solely defined by the appended claims.

What is claimed is:

1. A method of detecting a power of a signal transmitted by a power amplifier, the method comprising:
    receiving the signal at an input of a power detector, the input of the power detector coupled to one of a base and a gate, of an amplifying device in the power amplifier;
    shifting a voltage of the signal positively by a magnitude of a peak voltage of the signal generating a positive signal;
    providing the positive signal to a base input of an emitter follower generating a follower signal which follows the positive signal; and
    providing the follower signal to an output of the power detector, and to a first capacitor coupled to ground;
wherein the emitter follower presents a high impedance at the input of the power detector.

2. A method according to claim 1 wherein the step of shifting the voltage of the signal comprises:
    providing the signal across a capacitor to a cathode of a diode;
    wherein the cathode of the diode is coupled to the base input of the emitter follower, and
    wherein an anode of the diode is coupled to a voltage bias source.

3. A method according to claim 2 wherein the diode comprises a Schottky diode, wherein the voltage bias source comprises a temperature compensating voltage bias source, and wherein the emitter follower comprises a first transistor.

4. A method according to claim 3 wherein the first transistor comprises a BJT, wherein a collector of the BJT is coupled to a voltage supply, wherein the base input of the source-emitter follower is a base of the BJT, and wherein an emitter of the BJT is coupled to the output of the power detector and the first capacitor.

5. A method according to claim 4 further comprising:
    biasing a second transistor coupled between the output of the detector and ground thereby providing operating current for the first transistor.

6. A method according to claim 4 further comprising:
    biasing a second transistor coupled between the cathode of the Schottky diode and ground thereby boosting current passing through the Schottky diode.

7. A power detector circuit for detecting a power of a signal transmitted by a power amplifier, the power detector comprising:
    an input for receiving the signal coupled to one of a base and a gate of an amplifying device of the power amplifier;
    a voltage shifting circuit for shifting a voltage of the signal positively by a magnitude of a peak voltage of the signal and for generating a positive signal;
    an emitter follower for receiving at a base input of the emitter follower the positive signal, and for generating a follower signal which follows the positive signal;
    a first capacitor coupled to the source-emitter follower for receiving the follower signal, the first capacitor also coupled to ground; and
    an output for providing the detector voltage output signal from a combination of a voltage of the capacitor and the follower signal,
wherein the emitter follower presents a high impedance at the input of the power detector.

8. A circuit according to claim 7 wherein the voltage shifting circuit comprises:
    a capacitor coupled on a first side to the input of the power detector;
    a diode, wherein a cathode of the diode is coupled to a second side of the capacitor and is coupled to the base input of the emitter follower, and
    a voltage bias source coupled to an anode of the diode.

9. A circuit according to claim 8 wherein the diode comprises a Schottky diode, wherein the voltage bias source comprises a temperature compensating voltage bias source, and wherein the emitter follower comprises a first transistor.

10. A circuit according to claim 9 wherein the first transistor comprises a BJT, wherein a collector of the BJT is coupled to a voltage supply, and wherein an emitter of the BJT is coupled to the output of the power detector and the first capacitor.

11. A circuit according to claim 10 further comprising:
    a second transistor coupled between the output of the detector and ground; and
    a second voltage bias source coupled to a base of the second transistor providing operating current for the first transistor at the output of the power detector by appropriate biasing of the second transistor.

12. A circuit according to claim 10 further comprising:
    a second transistor coupled between the cathode of the Schottky diode and ground; and
    a second voltage bias source coupled to a base of the second transistor for boosting current passing through the Schottky diode by appropriate biasing of the second transistor.

* * * * *